(12) United States Patent
Delamare et al.

(10) Patent No.: US 11,074,260 B2
(45) Date of Patent: Jul. 27, 2021

(54) SPACE-EFFICIENT METHODOLOGY FOR REPRESENTING LABEL INFORMATION IN LARGE GRAPH DATA FOR FAST DISTRIBUTED GRAPH QUERY

(71) Applicant: Oracle International Corporation, Redwood Shores, CA (US)

(72) Inventors: Arnaud Delamare, Zürich (CH); Vasileios Trigonakis, Zürich (CH); Vlad Ioan Haprian, Zürich (CH); Oskar Van Rest, Mountain View, CA (US); Sungpack Hong, Palo Alto, CA (US); Hassan Chafi, San Mateo, CA (US); Tomas Faltin, Prague (CZ); Jean-Pierre Lozi, Zürich (CH)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 267 days.

(21) Appl. No.: 16/378,424

(22) Filed: Apr. 8, 2019

(65) Prior Publication Data
US 2020/0073868 A1 Mar. 5, 2020

Related U.S. Application Data

(60) Provisional application No. 62/726,934, filed on Sep. 4, 2018.

(51) Int. Cl.
*G06F 16/00* (2019.01)
*G06F 16/2453* (2019.01)
(Continued)

(52) U.S. Cl.
CPC .... *G06F 16/24549* (2019.01); *G06F 16/2237* (2019.01); *G06F 16/9024* (2019.01); *H03M 7/3088* (2013.01); *H03M 7/40* (2013.01)

(58) Field of Classification Search
CPC .......... G06F 16/2237; G06F 16/24549; G06F 16/9024
(Continued)

(56) References Cited

U.S. PATENT DOCUMENTS 10,146,828 B2 * 12/2018 Feo ........................ G06F 16/242
10,706,144 B1 * 7/2020 Moritz .................... G06F 21/55
(Continued)

*Primary Examiner* — Michelle N Owyang
(74) *Attorney, Agent, or Firm* — Hickman Becker Bingham Ledesma LLP

(57) ABSTRACT

Techniques are described herein for space-efficient encoding of label information of property graphs. In an embodiment, an input graph is received. The input graph comprises a plurality of entities and a plurality of label sets. Each entity of said plurality of entities is associated with a label set of the plurality of label sets and each label set of the plurality of label sets comprises zero or more labels of a plurality of labels. A first mapping is generated that maps each label of the plurality of labels to a label code. A second mapping is generated that maps each label integer set of a plurality of label integer sets to a label code. Each label integer set of the plurality of label integer sets corresponds to a label set of the plurality of label sets, wherein each label integer set of the plurality of label integer sets comprises label codes from the first mapping that are mapped to each label included in the corresponding label set. A compressed label set is generated for each entity of the plurality of entities. Each compressed label set comprises a plurality of bits that indicate a zeroth state, a first state, a second state, or a third state. The compressed label sets and the first and second mappings are used to efficiently evaluate graph label queries.

22 Claims, 6 Drawing Sheets

(51) Int. Cl.
    *G06F 16/901*       (2019.01)
    *G06F 16/22*        (2019.01)
    *H03M 7/40*         (2006.01)
    *H03M 7/30*         (2006.01)

(58) Field of Classification Search
    USPC .................................................. 707/600–899
    See application file for complete search history.

(56)                References Cited

U.S. PATENT DOCUMENTS 10,853,376 B2 *  12/2020  Jacob ................... G06F 16/2471
    2011/0221769 A1 *  9/2011  Leung .................... G06K 9/469
                                                                    345/633
    2015/0363510 A1 * 12/2015  Lin ...................... G06F 16/2246
                                                                    707/693
    2017/0169133 A1 *  6/2017  Kim .................... G06F 16/2237
    2019/0205480 A1 *  7/2019  Zhang ................. G06F 16/2228
    2019/0236848 A1 *  8/2019  Wallis ..................... H04L 41/12

* cited by examiner

FIG. 2

Tier 1 Dictionary 202

| Animal | 0 |
| Dog | 1 |
| Cat | 2 |
| ... | ... |
| Person | 100 |
| Student | 101 |
| Female | 102 |
| Male | 103 |
| Professor | 104 |

Tier 2 Dictionary 204

| {Person, Student, Female} = {100, 101, 102} | 0 |
| {Person, Student, Male} = {100, 101, 103} | 1 |

Compressed Label Sets 206

| Vertex | State | Contents |
|---|---|---|
| Vertex 102 | State two | {0, 1} |
| Vertex 104 | State two | {0, 2} |
| Vertex 106 | State zero | empty |
| ... | ... | |
| Vertex 108 | State three | 0 |
| Vertex 110 | State three | 1 |
| Vertex 112 | State three | 1 |
| Vertex 114 | State one | 104 |

SPACE-EFFICIENT METHODOLOGY FOR REPRESENTING LABEL INFORMATION IN LARGE GRAPH DATA FOR FAST DISTRIBUTED GRAPH QUERY

BENEFIT CLAIM

This application claims the benefit under 35 U.S.C. § 119(e) of provisional application 62/726,934, filed Sep. 4, 2018, the entire contents of which are hereby incorporated by reference for all purposes as if fully set forth herein.

FIELD OF THE INVENTION

The present invention relates to graph processing based on encoded representations of graphs.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Graph processing is an approach in data processing where the fine-grained relationships between data entities are materialized as graph edges between graph vertices. By analyzing such a graph, a user can get deeper insights about the dataset. The most prominent model of representing graphs is the property-graph model. In the property-graph model, vertices are connected through edges and, both vertices and edges, referred to herein as "entities", can be correlated with properties. For example, an entity can have an integer property called "age" with value "20." A label is a special type of property, which includes only the property name, without a value. For instance, an entity could have a label "person." Naturally, since labels are names, they are encoded/represented as string types in property graphs.

As labels can be viewed as the parallel of tables in relational databases, the number of labels is usually constant and not correlated to the number of vertices or edges of the graph. Most graphs usually have no more than 100 different labels. For example, to represent the functions of a university as a property graph, labels such as "course," "professor," "student," "classroom" can be used, and probably just a handful more.

Accordingly, storing this limited set of labels as per-entity strings is memory intensive. A lot of memory would be wasted by storing the same strings multiple times, which will further decrease performance by filling the caches and by performing costly string comparisons for queries. Therefore, modern graph processing systems, such as Neo4j, often employ dictionary encoding for storing labels. With dictionary encoding, each label is translated to a label code, represented by an integer value, and these label codes are then used to represent the labels of each entity. In our previous example, "course," "professor," "student," and "classroom" could be represented as 0, 1, 2, and 3, respectively.

Alternative solutions, which may be used in relational databases, include standard string compression, such as Huffman compression, which encodes each string with a code of variable length, inversely proportional to the frequency of said string. Other compression techniques use a radix tree which is efficient to store many strings with common parts, but provides much less advantages when it comes to storing a small set of strings.

Another is bitmap, in which each different string would have a vector of bits (one bit for each entity, 1 if the entity has this label, 0 if not). This technique works very well with a small number of labels but does not scale at all as the number of labels grows.

These techniques mainly focus on efficiently storing individual strings, not a set of strings, and suffer from lack of efficiency in storing a large number of sets of strings.

Discussed herein are approaches for space-efficient encoding of label information of property graphs.

BRIEF DESCRIPTION OF THE DRAWINGS

In the drawings:

FIG. 2 illustrates compressed label sets with tier 1 and tier 2 dictionary encodings.

DETAILED DESCRIPTION

Figure 1:
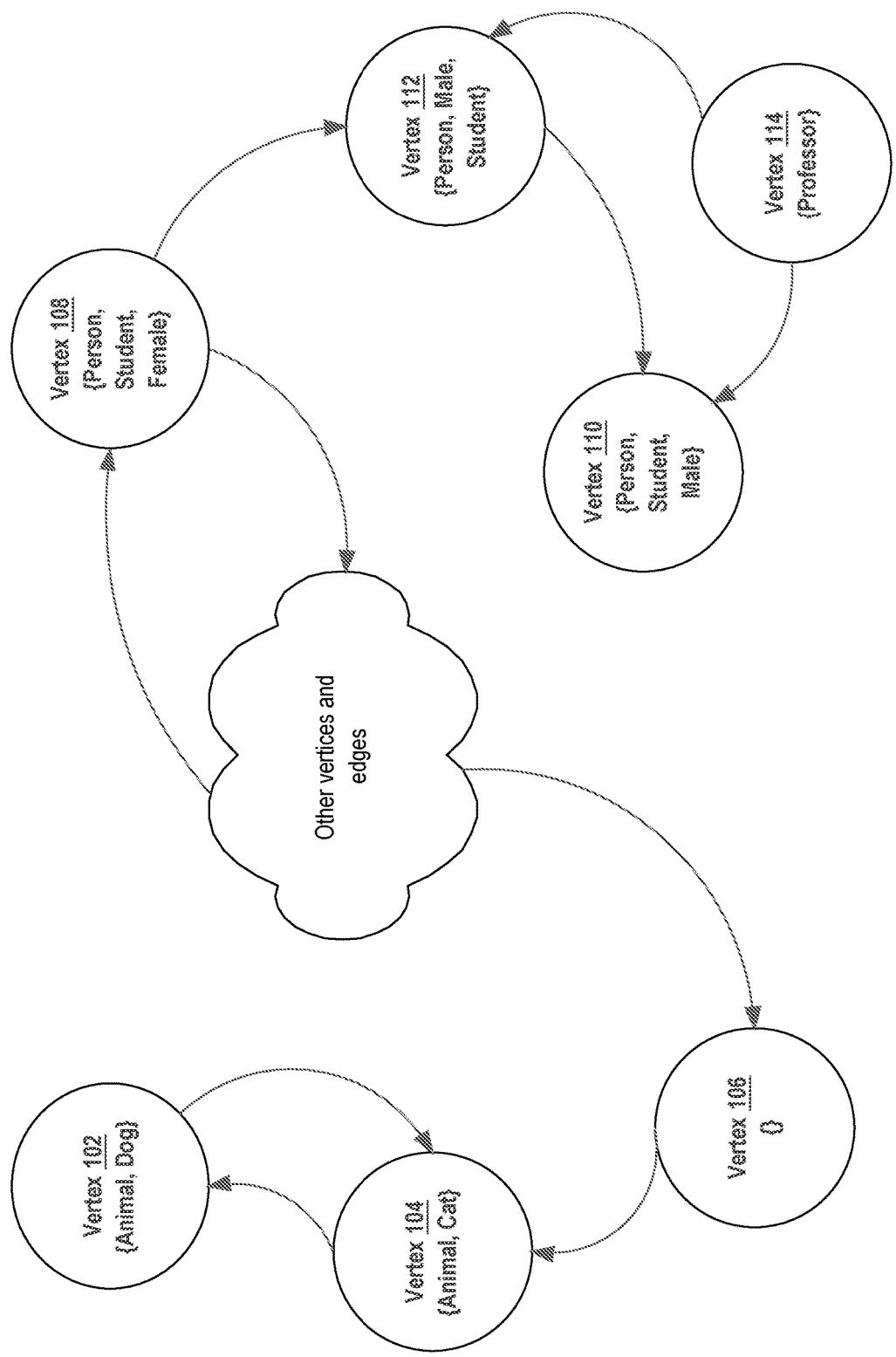
FIG. 1 illustrates a property graph with labels for each vertex of the property graph.

In the following description, for the purpose of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

General Overview

Techniques are described herein for space-efficient encoding of label information of property graphs.

According to an embodiment, each set of labels that is associated with the vertices and edges of a graph is represented by a sequence of bits, such as a 64-bit word. Each such sequence is referred to herein as a compressed label set because the word encodes a set of labels and thus represents the set of labels in compressed form. The encoding of a compressed label set is based on two forms of mappings or dictionaries. A tier 1 dictionary maps individual labels to label codes, e.g. integers. A tier 2 dictionary maps label sets to label set codes (e.g. integers). Thus, a label set code may represent a set of one or multiple labels.

In addition, each compressed label set may be in one of four states. The states govern whether and how the two dictionaries are used to encode and decode a compressed label set. A zeroth state specifies that the compressed label set contains no labels. A first state specifies that the compressed label set represents one label and includes the label code of the label.

The second state specifies that a bitmap in the compressed label set represents the labels in a set of labels encoded by the compressed label set. Each bit position in the bitmap corresponds to a particular label code in the tier 1 dictionary.

A bit being set at a particular position represents that the label mapped to the code that corresponds to the particular position is included in the set of labels. For example, the bit map "0101" has bits set that corresponds to integer codes 0 and 2, and represents a label set that includes the labels mapped to the label codes 0 and 2 by the tier 1 dictionary.

The third state represents that the compressed label set includes a reference or pointer to the tier 2 dictionary entry representing a particular set of labels represented by the compressed label set.

The graph label representations described herein bring functional and performance improvements to graph analytics and query engines. For example, memory consumption for storing entity labels is reduced by storing integer representations of labels. Additionally, performance benefits are achieved due to using simple integer arithmetic instead of string comparisons for label operations. Operations such as searching if a label exists in a label set and comparing two label sets for equality include set comparisons that are implemented using the compressed label sets. The compressed label sets allow for single integer comparisons thereby reducing CPU processing time and resources required for executing graph label operations.

Graph Initialization

Graph analytics software such as Parallel Graph AnalytiX (PGX) may be used to initialize a property graph for various operations. As referred to herein, PGX is a toolkit for graph analysis—both running algorithms such as PageRank against graphs and performing SQL-like pattern-matching against graphs, using the results of algorithmic analysis. Algorithms are parallelized for extreme performance. The PGX toolkit includes both a single-node in-memory engine, and a distributed engine for extremely large graphs. Graphs can be loaded from a variety of sources including flat files, SQL and NoSQL databases and Apache Spark and Hadoop. PGX is commercially available through ORACLE CORPORATION.

In an embodiment, graph analytics software such as PGX loads a graph with an Edgelist file and Edge JSON ("Java Script Object Notation") file. The Edgelist file contains graph information in edge-list format regarding vertex objects and edge objects to build the graphs.

The Edge JSON file is a JSON file provides a necessary configuration to PGX so that PGX can read graph data from the Edgelist file and generate a graph. In an embodiment, the Edge JSON file generates a PgxGraph, a java class of graphs that is operable by PGX. In an embodiment, a graph is loaded using PGX's 'readGraphWithProperties' functionality.

Graphs are generated based on vertex properties and edge properties, referred to herein as 'entity properties'. In the above-mentioned edge-list format, it is possible to pre-define multiple entity properties while loading the graph into a graph analytics framework such as PGX. For example, if there are multiple graphs comprising varying graph-ids, an entity property can be added that indicates which graph the specific entity belongs to. Then, the complete set of graphs can be loaded into PGX as a single large graph with multiple connected components and the individual connected components can be filtered out into separate graphs using such specific entity property. Additionally, a unique entity-id may be assigned to all the entities from different graphs in our dataset (i.e., no two graphs will have same entity-ids).

An entity property may comprise a label. A label is a special type of property, which includes only the property name, without a value. For instance, an entity could have a label "person." Since labels are names, they are encoded/represented as string types in property graphs. For example, the functions of a university as a property graph, labels such as "course," "professor," "student," "classroom," may be used.

FIG. 1 illustrates a property graph with labels for each vertex of the property graph. For example, in the graph of FIG. 1, each vertex includes zero or more labels. Vertex 102 includes labels 'Animal' and 'Dog'. Vertex 104 includes labels 'Animal' and 'Cat'. Vertex 106 includes no labels. Vertex 108 includes labels 'Person', 'Student', and 'Female'. Vertex 110 includes labels 'Person', 'Student', and 'Male'. Vertex 112 includes labels 'Person', 'Male', and 'Student'. Vertex 114 includes the label 'Professor'. Edges of a property graph may also include labels. For simplicity, the property graph of FIG. 1 only depicts vertices having labels.

Once a property graph is initialized, graph analytics software such as PGX may be used to analyze and perform operations using the graph data.

2-Tier Dictionary Encoding

A 2-tier dictionary encoding approach is used in tandem with compressed label sets, as described herein, to encode labels of a graph.

A first-tier dictionary stores all individual labels of a graph by assigning the string value of each label to a label code. FIG. 2 shows a tier 1 dictionary 202 that maps label string values of the property graph from FIG. 1 to label codes. For example, the label 'Animal' is mapped to the label code '0'. The label 'Dog' is mapped to the label code '1'. The label 'Person' is mapped to the label code '100'.

A second-tier dictionary stores all label sets of a graph by assigning each label set of the graph to a label set code. For example, FIG. 2 shows a tier 2 dictionary 204 that maps label sets to label set codes. For example, the label set {Person, Student, Female} is mapped to the label set code '0'. The label set {Person, Student, Male} is mapped to the label set code '1'.

In an embodiment, a second-tier dictionary stores the label sets of a graph that can only be represented in state three, by assigning each of the respective label sets of the graph to a label set code. Because a compressed set in state zero, one, or two is operable using only a first-tier dictionary and does not require a secondary set such as a second-tier dictionary, there is no need to assign label sets that are already adequately represented by the first-tier dictionary to a label set code, nor to add them in the second-tier dictionary.

Although it is depicted in the tier 2 dictionary 204 that label sets of string values such as {Person, Student, Female} are mapped to label set codes, e.g. '1', in one embodiment, each label set in the tier 2 dictionary 204 is represented by a label integer set. A label integer set replaces each label in a label set with corresponding label codes from the tier 1 dictionary 202. For example, the label set {Person, Student, Female} from the tier 2 dictionary 204 may be replaced by the label integer set {100, 101, 102} in the tier 2 dictionary 204, where each label code of the label integer set corresponds to a string value from the tier 1 dictionary.

In some embodiments, edges and vertices of a graph are separated into their own 2-tier dictionary encoding set. That is, labels associated with edges are stored in a first 2-tier dictionary encoding set that includes a first-tier dictionary and second-tier dictionary and labels associated with vertices are stores in a second 2-tier dictionary encoding set that includes a first-tier dictionary and second-tier dictionary.

Compressed Label Sets

A compressed label set is a data structure that offers a memory efficient, high performance approach to storing small cardinality sets of label codes. In particular, a compressed label set offers an efficient way of storing sets of labels for an entity of a property graph. A compressed label set comprises a label code, limited by a certain number of bits, e.g. 64 bits, which includes a state of the compressed label set in the two least significant bits and values of the compressed label set in the additional bits. The state of a compressed label set can take the following values:
- 0 (state zero): Indicates that the compressed label set is empty.
- 1 (state one): Indicates that the compressed label set stores a single value.
- 2 (state two): Indicates that the compressed label set represents up to 62 values in a 64-bit implementation, encoded as a bitmap.
- 3 (state three): Indicates that the compressed label set holds a pointer to the values externally (i.e., points to another data structure), because the compressed label set does not have enough space to encode them directly.

Thus, when a compressed label set is in state zero, the compressed label set is empty and does not store any values.

When a compressed label set is in state one, the compressed label set stores a single label code mapped to a label from the tier 1 dictionary. For example, for a compressed label set with 64 bits, if the two least significant bits of a compressed label set indicate a value of '1', then the remaining 62 bits store a single label code that is mapped to a label in the tier 1 dictionary.

When a compressed label set is in state two, the compressed label set stores label codes mapped to labels in the tier 1 dictionary encoded as a bitmap. For example, for a compressed label set with 64 bits, if the two least significant bits of a compressed label set indicate a value of '2', then the remaining 62 bits of the compressed label set are encoded as a bitmap. Each bit of a bitmap encoding represents a different label in the tier 1 dictionary. Specifically, the index of each bit in a bitmap corresponds to a label code that is mapped to a label in the tier 1 dictionary. For example, the first bit in a bitmap has an index of '0' and thus corresponds to a label code of '0' in the tier 1 dictionary. If the bit is on, i.e. set to '1', then the label that is mapped to label code '0' in the tier 1 dictionary is included in the compressed label set. Likewise, the fifth bit in a bitmap has an index of '4' in the bitmap and thus corresponds to a label code of '4' in the tier one dictionary. If the bit is on, i.e. set to '1', then the label that is mapped to label code '4' in the tier 1 dictionary is included in the compressed label set. Thus, by using a bitmap encoding with a tier 1 dictionary, a compressed label set can encode a large number of labels for an entity.

When a compressed label set is in state three, the compressed label set stores a single label set code mapped to a label set from the tier 2 dictionary. For example, for a compressed label set with 64 bits, if the two least significant bits of a compressed label set indicate a value of '3', then the remaining 62 bits of the compressed label set store a single label set code that is mapped to a label set in the tier 2 dictionary.

FIG. 2 illustrates compressed label sets with tier 1 and tier 2 dictionary encodings. Compressed label sets 206 includes a high-level representation of a compressed label set for each vertex of the property graph in FIG. 1. For example, compressed label sets 206 includes vertex 114 from FIG. 1 assigned to state one, with contents '104'. Contents '104' correspond to label code '104' in the tier 1 dictionary 202 which is mapped to label 'Professor'. Compressed label sets 206 includes vertex 102 from FIG. 1 assigned to state two, with contents {0, 1}. Contents {0, 1} correspond to label codes '0' and '1' in the tier 1 dictionary 202 which are mapped to labels 'Animal' and 'Dog', respectively. Compressed label sets 206 includes vertex 108 from FIG. 1 assigned to state three, with contents '0'. Because vertex 108 is in state three, contents '0' correspond to label code '0' in the tier 2 dictionary 204 which is mapped to label set {Person, Student, Female}.

Generating Compressed Label Sets

Once a property graph is initialized, tier 1 and tier 2 dictionaries may be generated for the labels of the property graph. A compressed label set may be generated for each entity of the property graph. For an entity, each label is translated using the first-tier dictionary to retrieve the corresponding label code of the respective label. The label code of each label of the entity is then inserted into the compressed label set for the entity.

The state of a compressed label set is then set as follows:

If the compressed label set is empty, the state of the compressed label set is set to zero.

If the compressed label set only holds a single value, then the state of the compressed label set is set to state one or state two, hence keeping the single value in the compressed label set without any external storage needed.

If each label code contained in the compressed label set is less or equal to 61, in a 64-bit implementation, then state two (bitmap) is used. No external storage is needed. This implies that if the set of all labels of a graph contains up to 62 values, which occurs often in property graphs, no compressed label sets will use external storage. Note that labels are dictionary encoded with values 0, 1, 2, . . . , number of labels—1;

Otherwise, in state three, the values of a compressed label set points to an external location where a set of labels is stored. In a simple implementation, state three directly points to a memory location where another set data structure, such as the tier-two dictionary, is stored.

Figure 3:
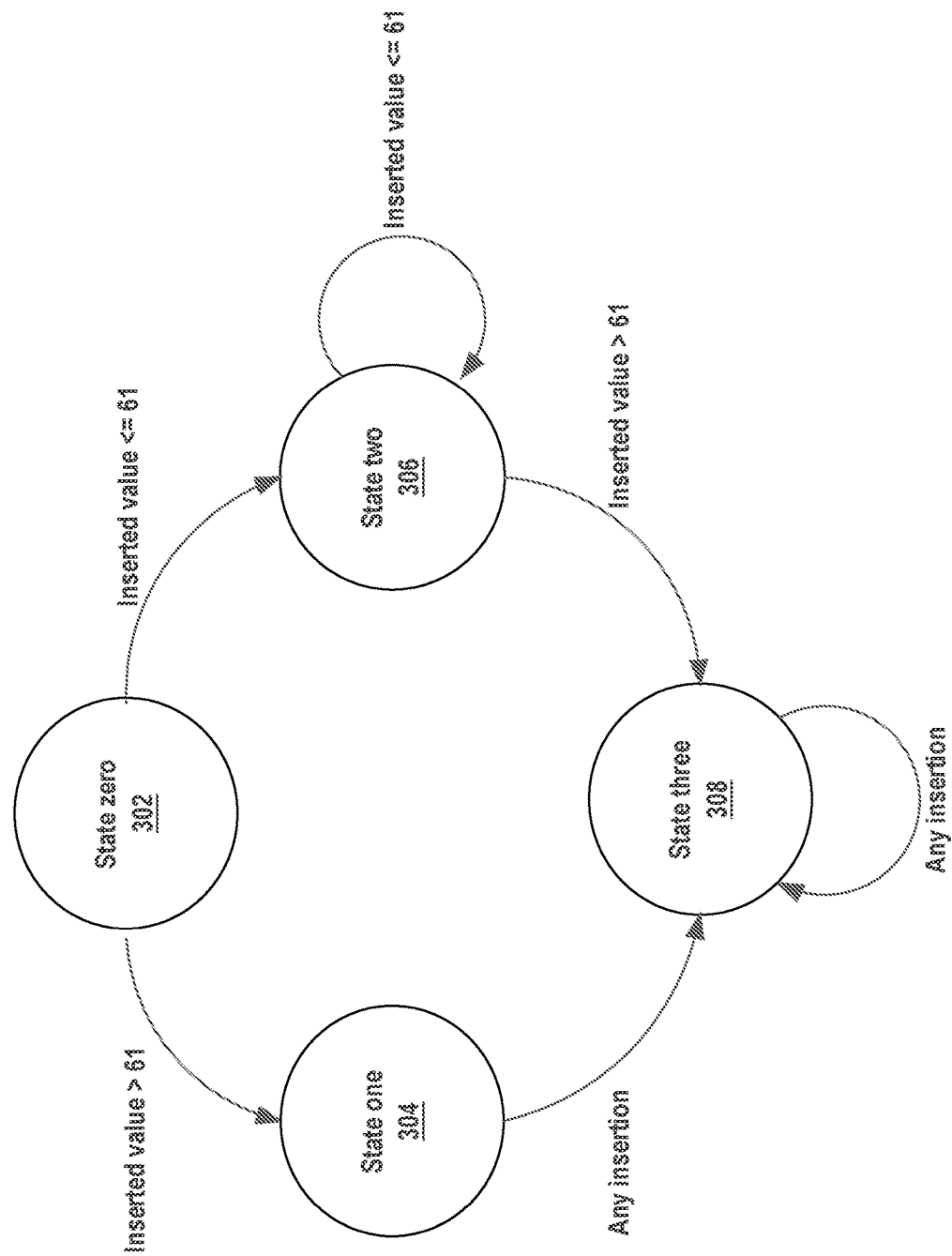
FIG. 3 is a diagram that describes changes in the state of a compressed label set when new values are inserted into a compressed label set.

FIG. 3 is a diagram that describes changes in the state of a compressed label set when new values are inserted into a compressed label set. For example, in a 64-bit implementation, when a compressed label set is in state zero 302, if a label code is inserted into the compressed label set that is greater than 61, the state of the compressed label set changes to state one 304, which holds a single label code. When a compressed label set is in state zero 302, if a label code is inserted into the compressed label set that is less than or equal to 61, the state of the compressed label set changes to state two 306, which holds a bitmap.

When a compressed label set is in state one 304, if any value is inserted into the compressed label set, the state of the compressed label set changes to state three 308, which points to external storage.

When a compressed label set is in state two 306, if a label code is inserted into the compressed label set that is less than or equal to 61, the state of the compressed label set does not change because the bitmap is capable of holding 62 values where each value is less than or equal to 61. When a compressed label set is in state two 306, if a label code is inserted into the compressed label set that is greater than 61, the state of the compressed label set changes to state three 308 because the bitmap of state two 306 is not capable of holding a value that is greater than 61.

When a compressed label set is in state three 308, if any label code is inserted into the compressed label set, the state of the compressed label set does not change. In this case, all values are retrieved from external storage.

Queries Using Compressed Label Sets and 2-Tier Dictionary Encodings

To return whether an entity has a specific label in its label set, i.e. the query 'entity has_label(label_name)', the following procedure is utilized:

First, the label included in the query is translated to a label code using the tier 1 dictionary. The compressed label set of the entity included in the query is then queried for the label code of the label.

If the entity is in state zero, then the compressed label set contains zero values and the entity does not have the label in its label set.

If the entity is in state one, then the compressed label set contains a single label code. In this state, the label code of the label is compared to the single label code included in the compressed label set, and the result is returned.

If the entity is in state two, then the compressed label set contains a bitmap encoding of values. In this state, the value of a bit in the bitmap at the index of the label code is used to determine if the entity has the label in its label set. For example, if the label code of the label is '2', then the bit at index '2' of the bitmap is examined to determine if the bit is set, i.e. set to '1'. If the bit at the index of the bitmap that corresponds to the label code of the label is set, then it is determined that the entity has the label in its label set and the result is returned.

If the entity is in state three, then the compressed label set contains a pointer label code that points to an external location. The pointer label code is translated to a label integer set using the tier 2 dictionary. The label code of the label is compared to the label codes included in the label integer set, and the result is returned.

To return whether a first entity and a second entity have the same label sets, a compressed label set of the first entity is compared to a compressed label set of the second entity. Because a compressed label set can be treated as an integer value, this procedure only requires a simple integer comparison.

To group-by the results of a query based on the labels of an entity, a compressed label set of the entity is treated as an integer value and the GROUP BY is executed on the integer value of the compressed label set.

Example Procedure

Figure 4:
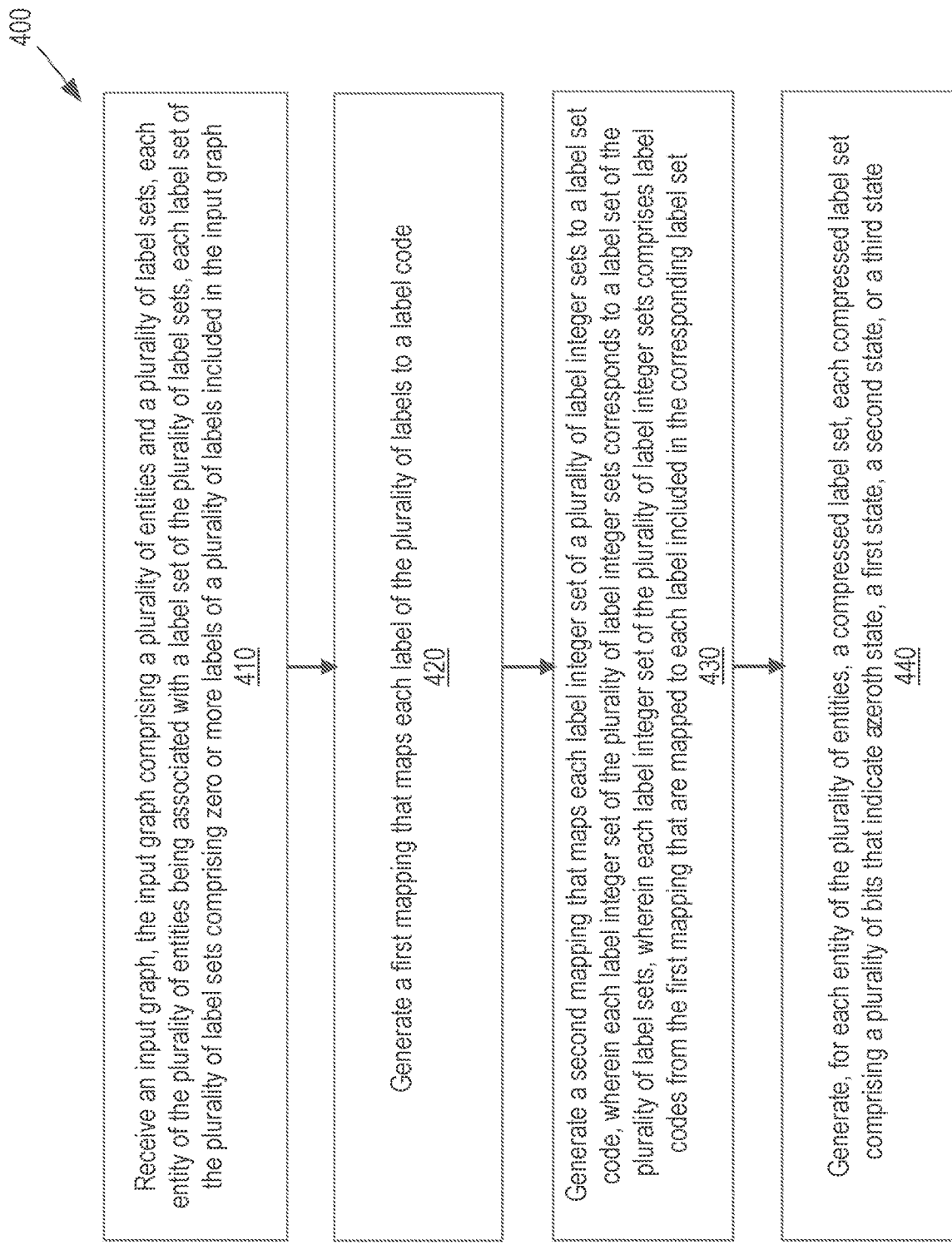
FIG. 4 is example procedure flow for space-efficient encoding of label information of property graphs.

FIG. 4 shows an example procedure flow 400 for space-efficient encoding of label information of property graphs. Flow 400 is one example of a flow for space-efficient encoding of label information of property graphs. Other flows may comprise fewer or additional elements, in varying arrangements.

In step 410, an input graph is received. The input graph comprises a plurality of entities and a plurality of label sets, each entity of the plurality of entities being associated with a label set of the plurality of label sets. Additionally, each label set of the plurality of label sets comprises zero or more labels of a plurality of labels included in the input graph. For example, FIG. 1 illustrates an example input graph. Each vertex 102-114 includes a label set of zero or more labels of a plurality of labels. Vertex 102, for example, includes the label set {Animal, Dog} which includes the individual labels 'Animal' and 'Dog'. Vertex 106 includes the label set { } which includes zero labels of the plurality of labels included in the input graph.

In step 420, a first mapping is generated that maps each label of the plurality of labels to a label code. For example, FIG. 2 shows a tier 1 dictionary 202 that maps each label from the property graph of FIG. 1 to a label code.

In step 430, a second mapping is generated that maps each label integer set of a plurality of label integer sets to a label set code, wherein each label integer set of the plurality of label integer sets corresponds to a label set of the plurality of label sets, wherein each label integer set of the plurality of label integer sets comprises label codes from the first mapping that are mapped to each label included in the corresponding label set. For example, FIG. 2 shows a tier 2 dictionary 204 that maps each label set from the property graph of FIG. 1 to a label set code. Each label set from the tier 2 dictionary 204 corresponds to a label integer set, e.g. the {Person, Student, Female} label set corresponds to the {100, 101, 102} label integer set. Each label integer set comprises label codes from the tier 1 dictionary 202 that are mapped to a label, e.g. integer set {100, 101, 102} comprises label codes '100', '101', '102' from the tier 1 dictionary 202 that are mapped to labels 'Person', 'Student', 'Female', respectively.

In step 440, for each entity of the plurality of entities, a compressed label set is generated. Each compressed label set comprises a plurality of bits that indicate a zeroth state, a first state, a second state, or a third state. The zeroth state indicates that the compressed label set for the respective entity is empty. The first state indicates that the compressed label set for the respective entity stores a single encoded value. The second state indicates that the compressed label set for the respective entity stores up to a threshold amount of encoded values encoded as a bitmap. The threshold amount of encoded values is determined by the number of bits allocated to the compressed label set. For example, if 64 bits is allocated for a compressed label set, two bits are allocated to indicate the state and the remaining 62 bits are allocated for encoded values. The third state indicates that the compressed label set for the respective entity stores a pointer integer value. The pointer integer value points to an external storage location, such as the tier 2 dictionary 204 from FIG. 2.

Once the compressed label sets, first mapping, and second mapping are constructed, graph queries requiring access to labels are efficiently executed using simple arithmetic comparison operations, as discussed herein.

Technical Benefits

The graph label representations described herein bring functional and performance improvements to graph analytics and query engines. For example, memory consumption for storing entity labels is reduced by storing integer representations of labels.

Additionally, using techniques described herein, performance benefits are achieved due to using simple integer arithmetic instead of string comparisons for the most important label operations. Operations such as searching if a label exists in a label set and comparing two label sets for equality include label set comparisons that are implemented with compressed label sets by single integer comparisons.

Furthermore, because each label set is encoded as a single, globally translatable integer which can be transmitted to other machines for comparing label sets, the amount of data sent across machines for distributed graph operations is heavily reduced.

Cloud Computing

The term "cloud computing" is generally used herein to describe a computing model which enables on-demand access to a shared pool of computing resources, such as computer networks, servers, software applications, and services, and which allows for rapid provisioning and release of resources with minimal management effort or service provider interaction.

A cloud computing environment (sometimes referred to as a cloud environment, or a cloud) can be implemented in a variety of different ways to best suit different requirements. For example, in a public cloud environment, the underlying computing infrastructure is owned by an organization that makes its cloud services available to other organizations or to the general public. In contrast, a private cloud environment is generally intended solely for use by, or within, a single organization. A community cloud is intended to be shared by several organizations within a community; while a hybrid cloud comprise two or more types of cloud (e.g., private, community, or public) that are bound together by data and application portability.

Generally, a cloud computing model enables some of those responsibilities which previously may have been provided by an organization's own information technology department, to instead be delivered as service layers within a cloud environment, for use by consumers (either within or external to the organization, according to the cloud's public/private nature). Depending on the particular implementation, the precise definition of components or features provided by or within each cloud service layer can vary, but common examples include: Software as a Service (SaaS), in which consumers use software applications that are running upon a cloud infrastructure, while a SaaS provider manages or controls the underlying cloud infrastructure and applications. Platform as a Service (PaaS), in which consumers can use software programming languages and development tools supported by a PaaS provider to develop, deploy, and otherwise control their own applications, while the PaaS provider manages or controls other aspects of the cloud environment (i.e., everything below the run-time execution environment). Infrastructure as a Service (IaaS), in which consumers can deploy and run arbitrary software applications, and/or provision processing, storage, networks, and other fundamental computing resources, while an IaaS provider manages or controls the underlying physical cloud infrastructure (i.e., everything below the operating system layer). Database as a Service (DBaaS) in which consumers use a database server or Database Management System that is running upon a cloud infrastructure, while a DbaaS provider manages or controls the underlying cloud infrastructure, applications, and servers, including one or more database servers.

The above-described basic computer hardware and software and cloud computing environment presented for purpose of illustrating the basic underlying computer components that may be employed for implementing the example embodiment(s). The example embodiment(s), however, are not necessarily limited to any particular computing environment or computing device configuration. Instead, the example embodiment(s) may be implemented in any type of system architecture or processing environment that one skilled in the art, in light of this disclosure, would understand as capable of supporting the features and functions of the example embodiment(s) presented herein.

Software Overview

Figure 5:
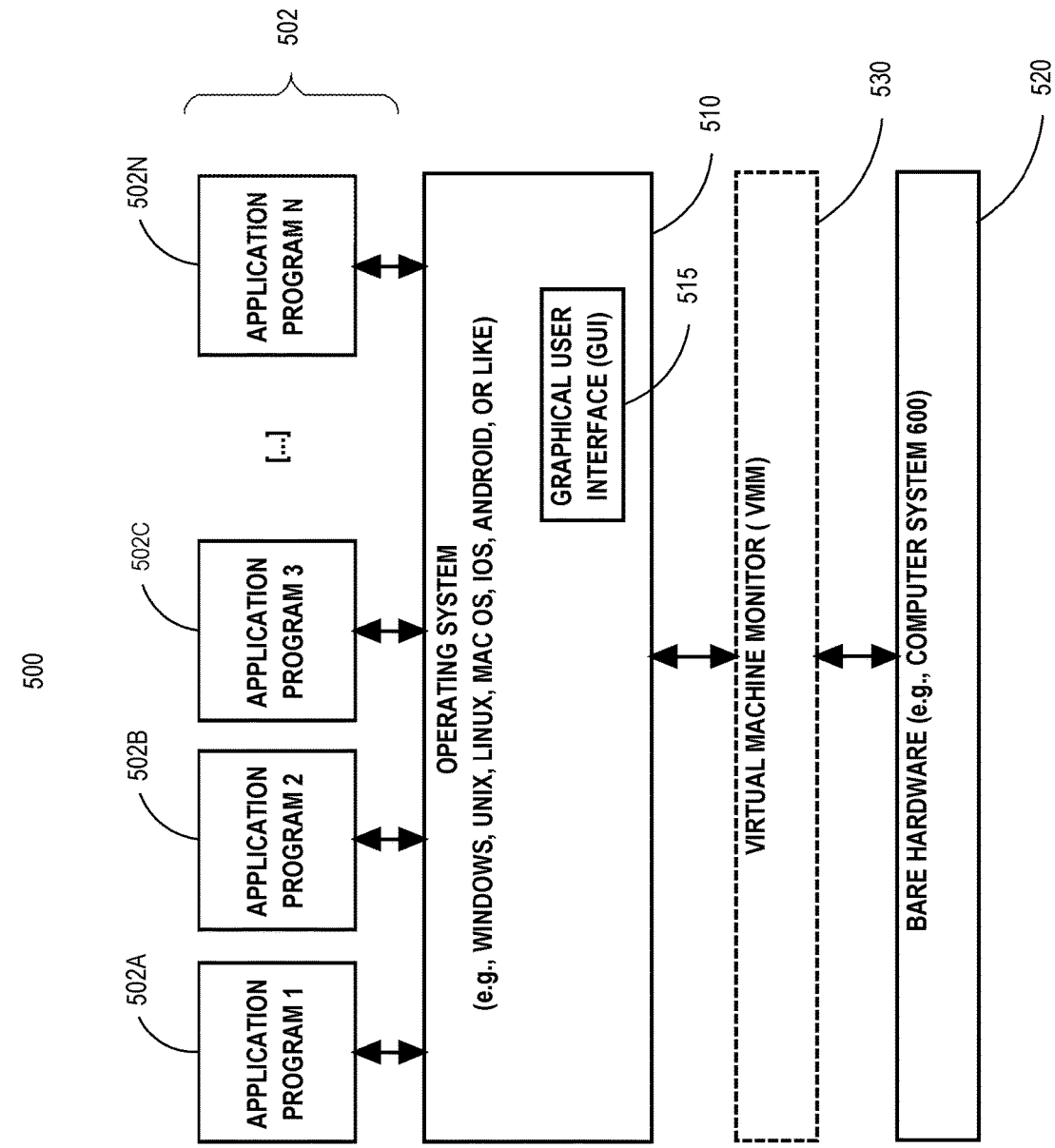
FIG. 5 is a diagram depicting a software system upon which an embodiment of the invention may be implemented.
Figure 6:
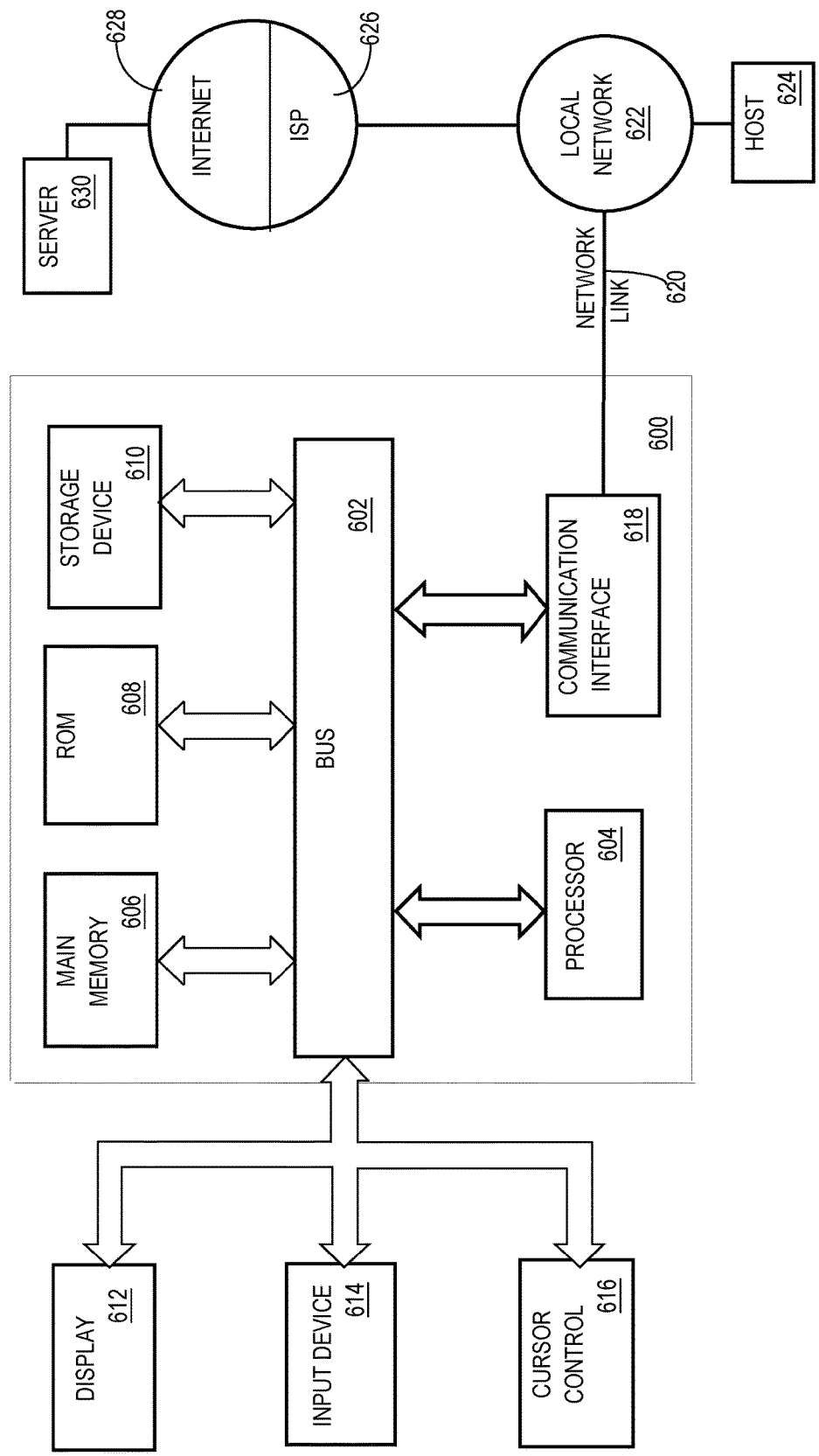
FIG. 6 is a diagram depicting a computer system that may be used in an embodiment of the present invention.

FIG. 5 is a block diagram of a basic software system 500 that may be employed for controlling the operation of computing system 600 of FIG. 6. Software system 500 and its components, including their connections, relationships, and functions, is meant to be exemplary only, and not meant to limit implementations of the example embodiment(s). Other software systems suitable for implementing the example embodiment(s) may have different components, including components with different connections, relationships, and functions.

Software system 500 is provided for directing the operation of computing system 600. Software system 500, which may be stored in system memory (RAM) 606 and on fixed storage (e.g., hard disk or flash memory) 610, includes a kernel or operating system (OS) 510.

The OS 510 manages low-level aspects of computer operation, including managing execution of processes, memory allocation, file input and output (I/O), and device I/O. One or more application programs, represented as 502A, 502B, 502C . . . 502N, may be "loaded" (e.g., transferred from fixed storage 610 into memory 606) for execution by the system 600. The applications or other software intended for use on computer system 600 may also be stored as a set of downloadable computer-executable instructions, for example, for downloading and installation from an Internet location (e.g., a Web server, an app store, or other online service).

Software system 500 includes a graphical user interface (GUI) 515, for receiving user commands and data in a graphical (e.g., "point-and-click" or "touch gesture") fashion. These inputs, in turn, may be acted upon by the system 500 in accordance with instructions from operating system 510 and/or application(s) 502. The GUI 515 also serves to display the results of operation from the OS 510 and application(s) 502, whereupon the user may supply additional inputs or terminate the session (e.g., log off).

OS 510 can execute directly on the bare hardware 520 (e.g., processor(s) 604) of computer system 600. Alternatively, a hypervisor or virtual machine monitor (VMM) 530 may be interposed between the bare hardware 520 and the OS 510. In this configuration, VMM 530 acts as a software "cushion" or virtualization layer between the OS 510 and the bare hardware 520 of the computer system 600.

VMM 530 instantiates and runs one or more virtual machine instances ("guest machines"). Each guest machine comprises a "guest" operating system, such as OS 510, and one or more applications, such as application(s) 502, designed to execute on the guest operating system. The VMM 530 presents the guest operating systems with a virtual operating platform and manages the execution of the guest operating systems.

In some instances, the VMM 530 may allow a guest operating system to run as if it is running on the bare hardware 520 of computer system 600 directly. In these instances, the same version of the guest operating system configured to execute on the bare hardware 520 directly may also execute on VMM 530 without modification or reconfiguration. In other words, VMM 530 may provide full hardware and CPU virtualization to a guest operating system in some instances.

In other instances, a guest operating system may be specially designed or configured to execute on VMM 530 for efficiency. In these instances, the guest operating system is "aware" that it executes on a virtual machine monitor. In other words, VMM 530 may provide para-virtualization to a guest operating system in some instances.

A computer system process comprises an allotment of hardware processor time, and an allotment of memory (physical and/or virtual), the allotment of memory being for storing instructions executed by the hardware processor, for storing data generated by the hardware processor executing the instructions, and/or for storing the hardware processor state (e.g. content of registers) between allotments of the hardware processor time when the computer system process is not running. Computer system processes run under the control of an operating system, and may run under the control of other programs being executed on the computer system.

Multiple threads may run within a process. Each thread also comprises an allotment of hardware processing time but share access to the memory allotted to the process. The memory is used to store content of processors between the allotments when the thread is not running. The term thread may also be used to refer to a computer system process in multiple threads are not running.

Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 6 is a block diagram that illustrates a computer system 600 upon which an embodiment of the invention may be implemented. Computer system 600 includes a bus 602 or other communication mechanism for communicating information, and a hardware processor 604 coupled with bus 602 for processing information. Hardware processor 604 may be, for example, a general-purpose microprocessor.

Computer system 600 also includes a main memory 606, such as a random-access memory (RAM) or other dynamic storage device, coupled to bus 602 for storing information and instructions to be executed by processor 604. Main memory 606 also may be used for storing temporary variables or other intermediate information during execution of instructions to be executed by processor 604. Such instructions, when stored in non-transitory storage media accessible to processor 604, render computer system 600 into a special-purpose machine that is customized to perform the operations specified in the instructions.

Computer system 600 further includes a read only memory (ROM) 608 or other static storage device coupled to bus 602 for storing static information and instructions for processor 604. A storage device 610, such as a magnetic disk or optical disk, is provided and coupled to bus 602 for storing information and instructions.

Computer system 600 may be coupled via bus 602 to a display 612, such as a cathode ray tube (CRT), for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

Computer system 600 may implement the techniques described herein using customized hard-wired logic, one or more ASICs or FPGAs, firmware and/or program logic which in combination with the computer system causes or programs computer system 600 to be a special-purpose machine. According to one embodiment, the techniques herein are performed by computer system 600 in response to processor 604 executing one or more sequences of one or more instructions contained in main memory 606. Such instructions may be read into main memory 606 from another storage medium, such as storage device 610. Execution of the sequences of instructions contained in main memory 606 causes processor 604 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 610. Volatile media includes dynamic memory, such as main memory 606. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 602. Transmission media can also take the form of acoustic or light waves, such as those generated during radio-wave and infra-red data communications.

Various forms of media may be involved in carrying one or more sequences of one or more instructions to processor 604 for execution. For example, the instructions may initially be carried on a magnetic disk or solid-state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN. Wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. ISP 626 in turn provides data communication services through the world-wide packet data communication network now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are example forms of transmission media.

Computer system 600 can send messages and receive data, including program code, through the network(s), network link 620 and communication interface 618. In the Internet example, a server 630 might transmit a requested code for an application program through Internet 628, ISP 626, local network 622 and communication interface 618.

The received code may be executed by processor 604 as it is received, and/or stored in storage device 610, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method comprising:
    storing an input graph, wherein the input graph comprises a plurality of vertices and a plurality of label sets, each vertex of said plurality of vertices being associated with a label set of the plurality of label sets, each label set of the plurality of label sets comprising zero or more labels of a plurality of labels;
    storing a first mapping that maps each label of the plurality of labels to a label code;
    storing a second mapping that maps each label integer set of a plurality of label integer sets to a label set code, wherein each label integer set of the plurality of label integer sets corresponds to a label set of the plurality of label sets, wherein each label integer set of the plurality of label integer sets comprises label codes from the first mapping that are mapped to each label included in the corresponding label set;
    for each vertex of the plurality of vertices, storing a compressed label set, each compressed label set comprising a plurality of bits that indicate a zeroth state, a first state, a second state, or a third state;
    wherein the zeroth state indicates that the compressed label set for the respective vertex is empty;
    wherein the first state indicates that the compressed label set for the respective vertex stores a single encoded value;
    wherein the second state indicates that the compressed label set for the respective vertex stores up to a threshold amount of encoded values;
    wherein the third state indicates that the compressed label set for the respective vertex stores a pointer integer value;
    executing a graph query, wherein the graph query includes a particular label, wherein executing the graph query includes:
        determining whether the label set of a particular vertex of the plurality of vertices includes the particular label by at least:
            using the first mapping, identifying a particular label code mapped to the particular label;
            in response to determining that the compressed label set of the particular vertex is in the first state, the second state, or the third state, determining, based on the particular label code, that the label set of the particular vertex of the plurality of vertices includes the particular label;
    returning a result of the graph query that includes an indication that that the label set of the particular vertex of the plurality of vertices includes the particular label.

2. The method of claim 1, wherein each label code comprises an integer value and wherein each label set code comprises an integer value.

3. The method of claim 1, wherein said input graph includes a plurality of edges, each edge of said plurality of edges being associated with a label set of the plurality of label sets.

4. The method of claim 1, wherein when the compressed label set of the particular vertex is in the second state, the compressed label set of the particular vertex stores a bitmap encoding of values.

5. The method of claim 4, wherein each bit of the bitmap encoding of values is mapped to a label code included in the first mapping.

6. The method of claim 4, wherein the threshold amount of encoded values is based on a number of bits in each of the compressed label sets stored for the plurality of vertices.

7. The method of claim 1, when the compressed label set of the particular vertex is in the third state, the pointer integer value stored in the compressed label set of the particular vertex points to a label set code included in the second mapping.

8. The method of claim 1, further comprising:
    in response to determining that the compressed label set of the particular vertex is in the first state, determining whether the particular label code matches the single encoded value of the compressed label set of the particular vertex;
    in response to identifying a match between the particular label code and the single encoded value of the compressed label set of the particular vertex, determining that the label set of the particular vertex of the plurality of vertices includes the particular label.

9. The method of claim 1, further comprising:
in response to determining that the compressed label set of the particular vertex is in the second state, determining whether a bit of the plurality of bits that corresponds to the particular label code is set;
in response to determining that the bit of the plurality of bits that corresponds to the particular label code is set, determining that the label set of the particular vertex of the plurality of vertices includes the particular label.

10. The method of claim 1, further comprising:
in response to determining that the compressed label set of the particular vertex is in the third state, using the second mapping, identifying a particular label integer set mapped to the label set code that corresponds to the pointer integer value;
in response to identifying a match between the particular label code and a label code included in particular label integer set, determining that the label set of the particular vertex of the plurality of vertices includes the particular label.

11. The method of claim 1, further comprising:
receiving a request to determine whether a first vertex of the plurality of vertices and a second vertex of the plurality of vertices have the same label set;
in response to identifying a match between the compressed label set of the first vertex and the compressed label set of the second vertex, determining that the first vertex of the plurality of vertices and the second vertex of the plurality of vertices have the same label set.

12. A non-transitory computer-readable storage medium storing sequences of instructions that, when executed by one or more processors, cause:
storing an input graph, wherein the input graph comprises a plurality of vertices and a plurality of label sets, each vertex of said plurality of vertices being associated with a label set of the plurality of label sets, each label set of the plurality of label sets comprising zero or more labels of a plurality of labels;
storing a first mapping that maps each label of the plurality of labels to a label code;
storing a second mapping that maps each label integer set of a plurality of label integer sets to a label set code, wherein each label integer set of the plurality of label integer sets corresponds to a label set of the plurality of label sets, wherein each label integer set of the plurality of label integer sets comprises label codes from the first mapping that are mapped to each label included in the corresponding label set;
for each vertex of the plurality of vertices, storing a compressed label set, each compressed label set comprising a plurality of bits that indicate a zeroth state, a first state, a second state, or a third state;
wherein the zeroth state indicates that the compressed label set for the respective vertex is empty;
wherein the first state indicates that the compressed label set for the respective vertex stores a single encoded value;
wherein the second state indicates that the compressed label set for the respective vertex stores up to a threshold amount of encoded values;
wherein the third state indicates that the compressed label set for the respective vertex stores a pointer integer value;

executing a graph query, wherein the graph query includes a particular label, wherein executing the graph query includes:
determining whether the label set of a particular vertex of the plurality of vertices includes the particular label by at least:
using the first mapping, identifying a particular label code mapped to the particular label;
in response to determining that the compressed label set of the particular vertex is in the first state, the second state, or the third state, determining, based on the particular label code, that the label set of the particular vertex of the plurality of vertices includes the particular label,
returning a result of the graph query that includes an indication that that the label set of the particular vertex of the plurality of vertices includes the particular label.

13. The non-transitory computer-readable storage medium of claim 12, wherein each label code comprises an integer value and wherein each label set code comprises an integer value.

14. The non-transitory computer-readable storage medium of claim 12, wherein said input graph includes a plurality of edges, each edge of said plurality of edges being associated with a label set of the plurality of label sets.

15. The non-transitory computer-readable storage medium of claim 12, wherein when the compressed label set of the particular vertex is in the second state, the compressed label set of the particular vertex stores a bitmap encoding of values.

16. The non-transitory computer-readable storage medium of claim 15, wherein each bit of the bitmap encoding of values is mapped to a label code included in the first mapping.

17. The non-transitory computer-readable storage medium of claim 15, wherein the threshold amount of encoded values is based on a number of bits in each of the compressed label sets stored for the plurality of vertices.

18. The non-transitory computer-readable storage medium of claim 12, wherein when the compressed label set of the particular vertex is in the third state, the pointer integer value stored in the compressed label set of the particular vertex points to a label set code included in the second mapping.

19. The non-transitory computer-readable storage medium of claim 12, the sequences of instructions including instruction that, when executed by said one or more processors, cause:
in response to determining that the compressed label set of the particular vertex is in the first state, determining whether the particular label code matches the single encoded value of the compressed label set of the particular vertex;
in response to identifying a match between the particular label code and the single encoded value of the compressed label set of the particular vertex, determining that the label set of the particular vertex of the plurality of vertices includes the particular label.

20. The non-transitory computer-readable storage medium of claim 12, the sequences of instructions including instruction that, when executed by said one or more processors, cause:
in response to determining that the compressed label set of the particular vertex is in the second state, determining whether a bit of the plurality of bits that corresponds to the particular label code is set;

in response to determining that the bit of the plurality of bits that corresponds to the particular label code is set, determining that the label set of the particular vertex of the plurality of vertices includes the particular label.

21. The non-transitory computer-readable storage medium of claim 12, the sequences of instructions including instruction that, when executed by said one or more processors, cause:

in response to determining that the compressed label set of the particular vertex is in the third state, using the second mapping, identifying a particular label integer set mapped to the label set code that corresponds to the pointer integer value;

in response to identifying a match between the particular label code and a label code included in particular label integer set, determining that the label set of the particular vertex of the plurality of vertices includes the particular label.

22. The non-transitory computer-readable storage medium of claim 12, the sequences of instructions including instruction that, when executed by said one or more processors, cause:

receiving a request to determine whether a first vertex of the plurality of vertices and a second vertex of the plurality of vertices have the same label set;

in response to identifying a match between the compressed label set of the first vertex and the compressed label set of the second vertex, determining that the first vertex of the plurality of vertices and the second vertex of the plurality of vertices have the same label set.

\* \* \* \* \*

UNITED STATES PATENT AND TRADEMARK OFFICE
CERTIFICATE OF CORRECTION

PATENT NO. : 11,074,260 B2  
APPLICATION NO. : 16/378424  
DATED : July 27, 2021  
INVENTOR(S) : Delamare et al.

Page 1 of 1

It is certified that error appears in the above-identified patent and that said Letters Patent is hereby corrected as shown below:

In the Drawings

On sheet 4 of 6, in FIG. 4, under Reference Numeral 440, Line 2, and on the Title Page, the print figure, delete "azeroth" and insert -- a zeroth --, therefor.

In the Specification

In Column 9, Line 54, delete "DbaaS" and insert -- DBaaS --, therefor.

In the Claims

In Column 14, Line 35, in Claim 1, delete "that that" and insert -- that --, therefor.

In Column 16, Line 15, in Claim 12, delete "label," and insert -- label; --, therefor.

In Column 16, Line 17, in Claim 12, delete "that that" and insert -- that --, therefor.

Signed and Sealed this  
Fourth Day of January, 2022

Drew Hirshfeld  
*Performing the Functions and Duties of the*  
*Under Secretary of Commerce for Intellectual Property and*  
*Director of the United States Patent and Trademark Office*